US010903147B2

(12) United States Patent
Sakutani

(10) Patent No.: US 10,903,147 B2
(45) Date of Patent: Jan. 26, 2021

(54) SEMICONDUCTOR DEVICE

(71) Applicant: Mitsubishi Electric Corporation, Tokyo (JP)

(72) Inventor: Kazuhiko Sakutani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/570,459

(22) Filed: Sep. 13, 2019

(65) Prior Publication Data

US 2020/0194352 A1  Jun. 18, 2020

(30) Foreign Application Priority Data

Dec. 13, 2018 (JP) ................................. 2018-233041

(51) Int. Cl.
*H01L 23/495* (2006.01)
(52) U.S. Cl.
CPC .. *H01L 23/49555* (2013.01); *H01L 23/49582* (2013.01); *H01L 23/49589* (2013.01)
(58) Field of Classification Search
CPC ......... H01L 23/49555; H01L 23/49582; H01L 23/49589

USPC ......................................................... 257/677
See application file for complete search history.

(56) References Cited

U.S. PATENT DOCUMENTS

| 2005/0287843 | A1 | 12/2005 | Tsukamoto |
| 2010/0328961 | A1* | 12/2010 | Kwon ..................... H05K 3/301 |
| | | | 362/375 |

FOREIGN PATENT DOCUMENTS

| JP | H09-260577 A | 10/1997 |
| JP | 2006-013018 A | 1/2006 |
| JP | 2008-130954 A | 6/2008 |

* cited by examiner

*Primary Examiner* — Caleen O Sullivan
(74) *Attorney, Agent, or Firm* — Studebaker & Brackett PC

(57) ABSTRACT

A first lead and a second lead are adjacent. The first lead has a first sinking portion. The second lead has a second sinking portion. The first sinking portion and the second sinking portion are opposed so that the first sinking portion and the second sinking portion sandwich a space. The first sinking portion and the second sinking portion are configured so that the first sinking portion presses a first electrode, and the second sinking portion presses a second electrode in a containing state.

13 Claims, 10 Drawing Sheets

F I G 3
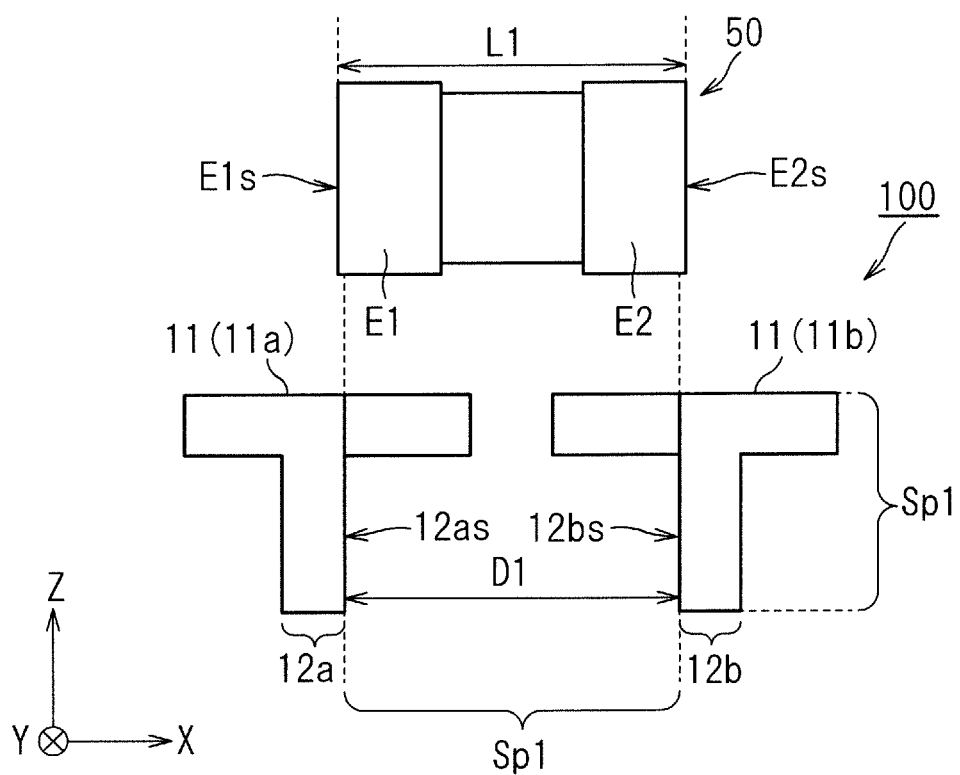

F I G. 6
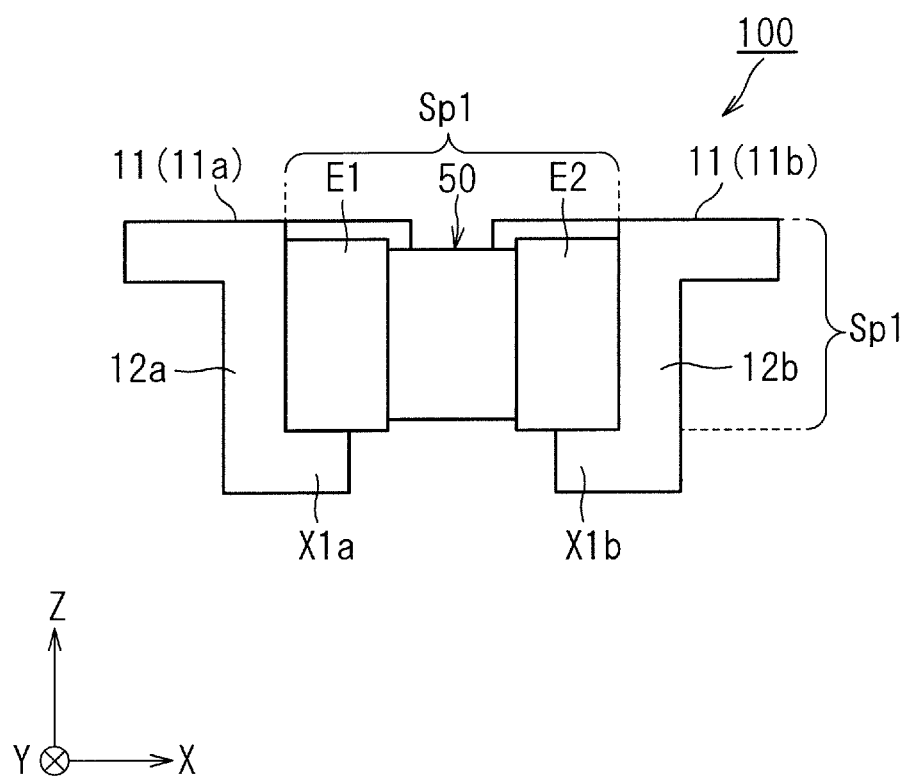

F I G. 9
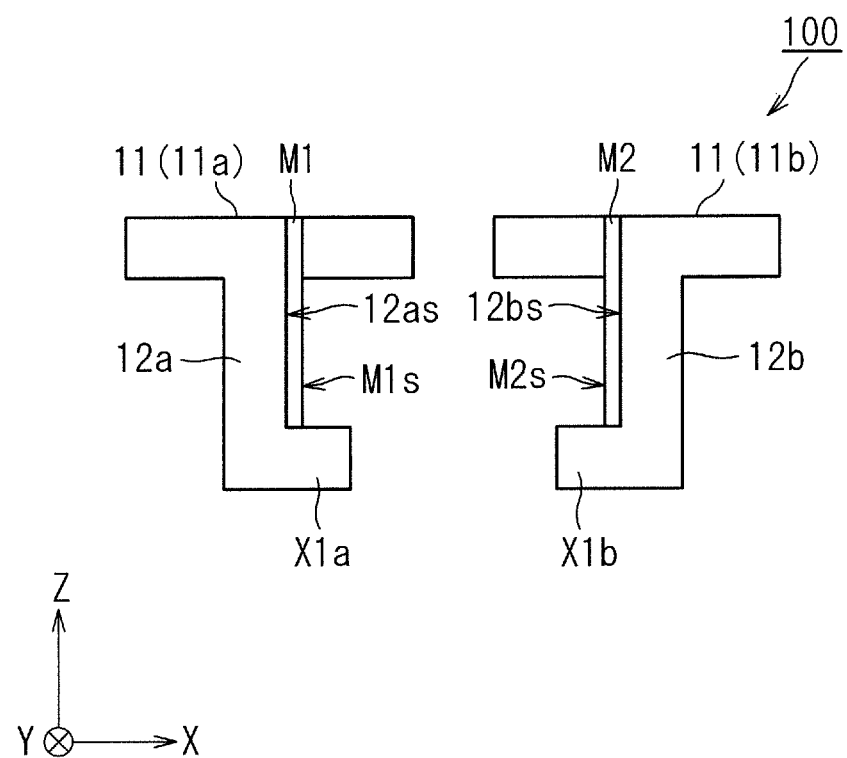

F I G. 1 0
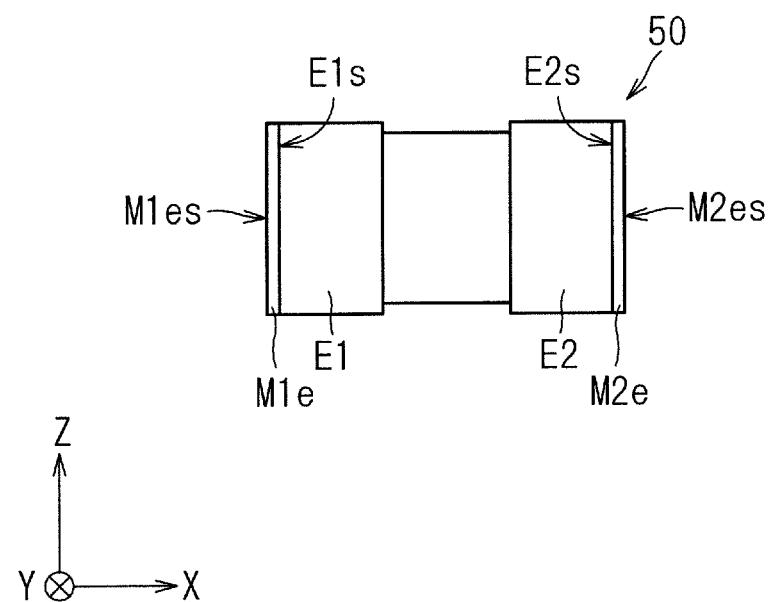

SEMICONDUCTOR DEVICE

BACKGROUND OF THE INVENTION

Field of the Invention

The present invention relates to a semiconductor device having a configuration utilizing a lead frame.

Description of the Background Art

In regards to a semiconductor device of electronic equipment or the like, downsizing and low cost have been required. Moreover, high integration of a chip part mounted on a substrate of the semiconductor device has advanced. The relevant chip part is, for example, an electronic part for surface mounting. Consequently, incorporation of a peripheral function in the semiconductor device as a module has advanced. For example, the chip part needs to be incorporated in the semiconductor device as a module. The relevant chip part is, for example, a capacitor, a thermistor, or the like.

Conventionally, when the chip part is joined to a lead frame, a joining material having conductivity has been used. The relevant joining material is, for example, an Ag paste, solder, or the like. When the chip part for surface mounting is joined to the lead frame by the joining material, a joining process below needs to be performed after applying the joining material to the lead frame and disposing the relevant chip part.

In the joining process in a situation where the joining material is the Ag paste, for example, the relevant Ag paste is baked and hardened with an oven. Moreover, in the joining process in a situation where the joining material is the solder, the solder is melted at a high temperature of about 270 degrees with reflow. The foregoing joining process has problems that a high-temperature state occurs, and that processing time is long.

Consequently, a technique is required in which the chip part is fixed to the lead frame without using the joining material. In Japanese Patent Application Laid-Open No. H9-260577 (1997), a configuration has been disclosed in which a chip part is fixed to a lead frame without using the joining material (hereinafter, also referred to as a "related configuration A"). In the related configuration A, a semiconductor chip (chip part) is fixed to the lead frame by four fixing pins.

In the lead frame, a plurality of leads as terminals exist. There are cases where it is necessary to fix the chip part having two electrodes to the lead frame having the above-described configuration without using the joining material. In this case, it is required that the two electrodes of the chip part are fixed to two adjacent leads included in the plurality of leads of the lead frame. In the related configuration A, this requirement cannot be satisfied.

SUMMARY

An object of the present invention is to provide a semiconductor device capable of fixing two electrodes of a chip part to two adjacent leads without using a joining material.

A semiconductor device according to one aspect of the present invention has a space for containing a chip part. The semiconductor device includes the chip part having a first electrode and a second electrode; and a lead frame having a first lead and a second lead as terminals, wherein the first lead and the second lead are adjacent, the space exists across the first lead and the second lead, the first lead has a first sinking portion, the second lead has a second sinking portion, the first sinking portion and the second sinking portion are opposed so that the first sinking portion and the second sinking portion sandwich the space, as a state of the space, there is a containing state where the chip part is contained in the space, the first electrode exists in the chip part so that the first electrode and the first sinking portion are opposed in the containing state, the second electrode exists in the chip part so that the second electrode and the second sinking portion are opposed in the containing state, and the first sinking portion and the second sinking portion are configured so that in the containing state, the first sinking portion presses the first electrode, and the second sinking portion presses the second electrode.

According to the present invention, the first lead and the second lead are adjacent. The first lead has the first sinking portion. The second lead has the second sinking portion. The first sinking portion and the second sinking portion are opposed so that the first sinking portion and the second sinking portion sandwich the space. The first sinking portion and the second sinking portion are configured so that the first sinking portion presses the first electrode, and the second sinking portion presses the second electrode in the containing state.

This allows the two electrodes of the chip part to be fixed to the two adjacent leads without using the joining material.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a view for describing a length of the chip part;

FIG. 6 is a view for describing a configuration of a second modification;

FIG. 9 is a view for describing a configuration of a fifth modification; and FIG. 10 is a view showing a configuration of the chip part according to a sixth modification.

DESCRIPTION OF THE PREFERRED EMBODIMENT

Hereinafter, a preferred embodiment will be described with reference to the drawings. In the following drawings, the same components are denoted by the same reference sign. Names and functions of the components denoted by the same reference sign are the same. Therefore, detailed descriptions of a part of the components denoted by the same reference sign may be omitted.

It should be noted that dimensions, materials, and shapes of the components exemplified in the preferred embodiment, relative arrangement of the components, and the like may be appropriately changed according to a configuration of a device, various conditions, and the like. Moreover, the dimensions of each of the components in each of the drawings may be different from actual dimensions.

First Preferred Embodiment

Figure 1:
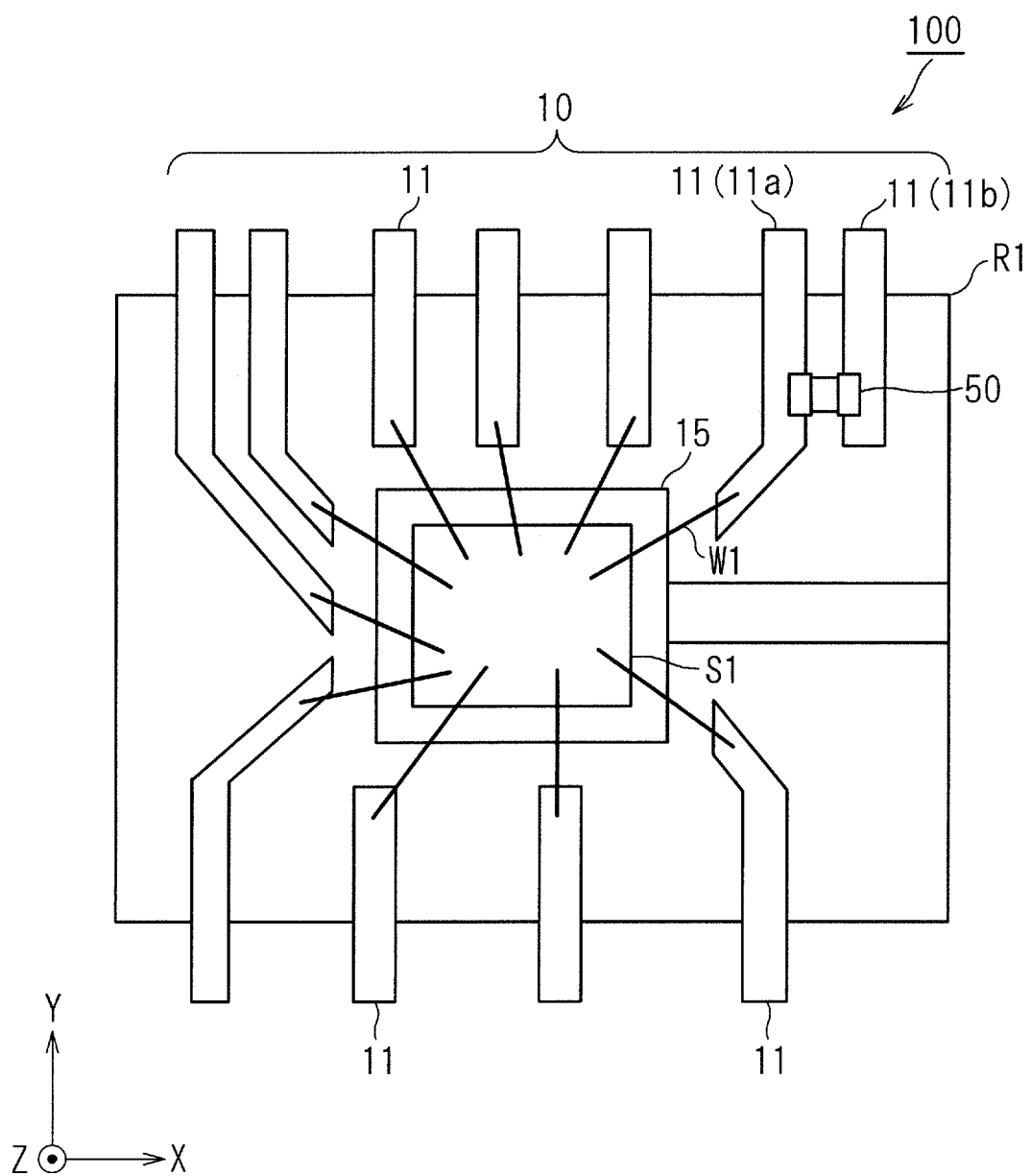
FIG. 1 is a plane view showing a configuration of a semiconductor device according to a first preferred embodiment.

FIG. 1 is a plane view showing a configuration of a semiconductor device 100 according to a first preferred embodiment. The semiconductor device 100 is a module. The semiconductor device 100 is, for example, a semiconductor device for electric power.

In FIG. 1, an X direction, a Y direction, and a Z direction are orthogonal to one another. The X direction, the Y direction, and the Z direction shown in the following figures are also orthogonal to one another. In the following description, a direction including the X direction and a direction opposite to the X direction (−X direction) is also referred to as an "X axis direction". Moreover, in the following description, a direction including the Y direction and a direction opposite to the Y direction (−Y direction) is also referred to as a "Y axis direction". In the following description, a direction including the Z direction and a direction opposite to the Z direction (−Z direction) is also referred to as a "Z axis direction".

In the following description, a plane including the X axis direction and the Y axis direction is also referred to as an "XY plane". In the following description, a plane including the X axis direction and the Z axis direction is also referred to as an "XZ plane". In the following description, a plane including the Y axis direction and the Z axis direction is also referred to as a "YZ plane".

Referring to FIG. 1, the semiconductor device 100 includes a lead frame 10, a chip part 50, and a resin R1. In FIG. 1, in order to make a configuration easy to understand, the relevant resin R1 is shown transparently. The lead frame 10 is sealed by the resin R1. The resin R1 is, for example, a mold resin.

The lead frame 10 has a plurality of leads 11 as terminals, and a die pad 15. A semiconductor chip S1 is joined to the die pad 15 through a joining material. Each of the leads 11 is a terminal for the semiconductor chip S1 to be electrically connected to, for example, an external substrate not shown or the like. Moreover, the plurality of leads 11 are arranged so that the relevant plural leads 11 surround the die pad 15. Each of the leads 11 is connected to the semiconductor chip S1 through a wire W 1. Each of the leads 11, the die pad 15, the semiconductor chip S1, the chip part 50, and the like are sealed by the resin R1. A forefront of each of the leads 11 is exposed from the resin R1. The forefront of each of the leads 11 is electrically connected, for example, to an external substrate not shown.

In the foregoing, two adjacent leads included in the plurality of leads 11 are also referred to as leads 11a, 11b, respectively.

The chip part 50 is, for example, an electronic part as a component of an electric circuit. The relevant chip part 50 is an electronic part for surface mounting. The relevant chip part 50 is, for example, a capacitor, a thermistor, a resistor, or the like. The chip part 50 is disposed, for example, so as to straddle the leads 11a, 11b.

Figure 2A:
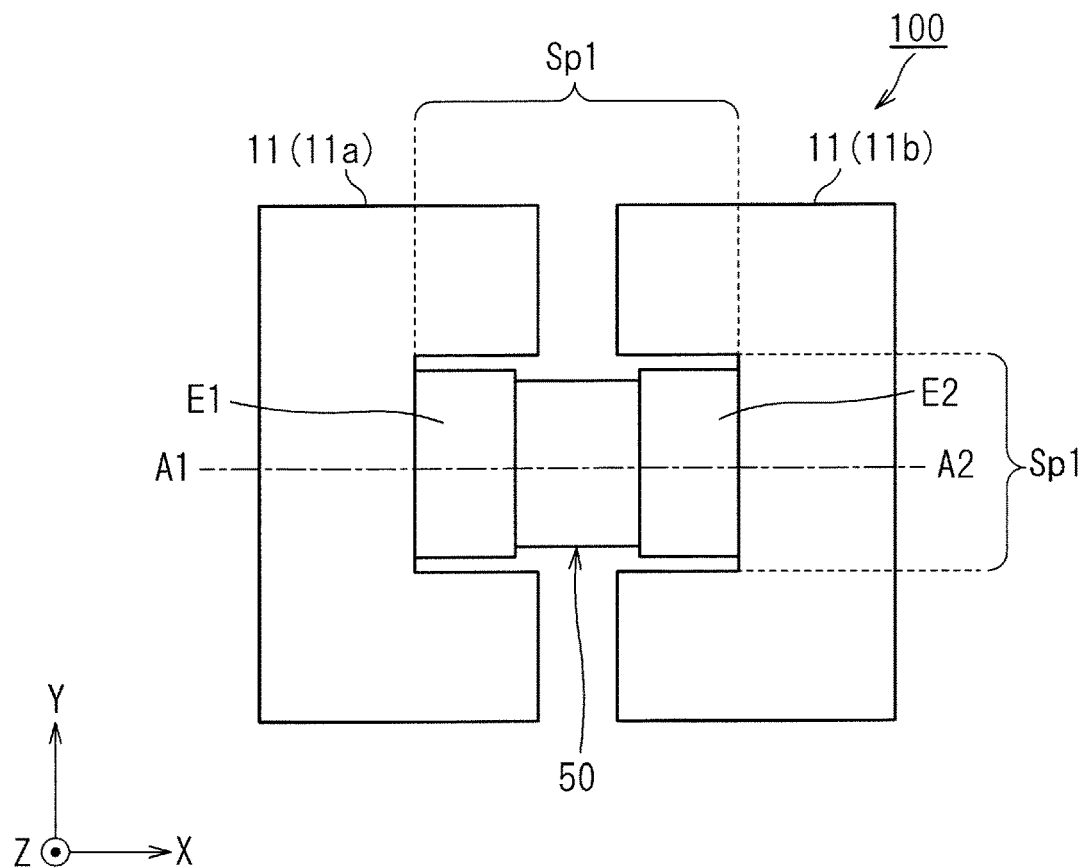
FIGS. 2A and 2B are enlarged views of a periphery of a chip part in FIG. 1.
Figure 2B:
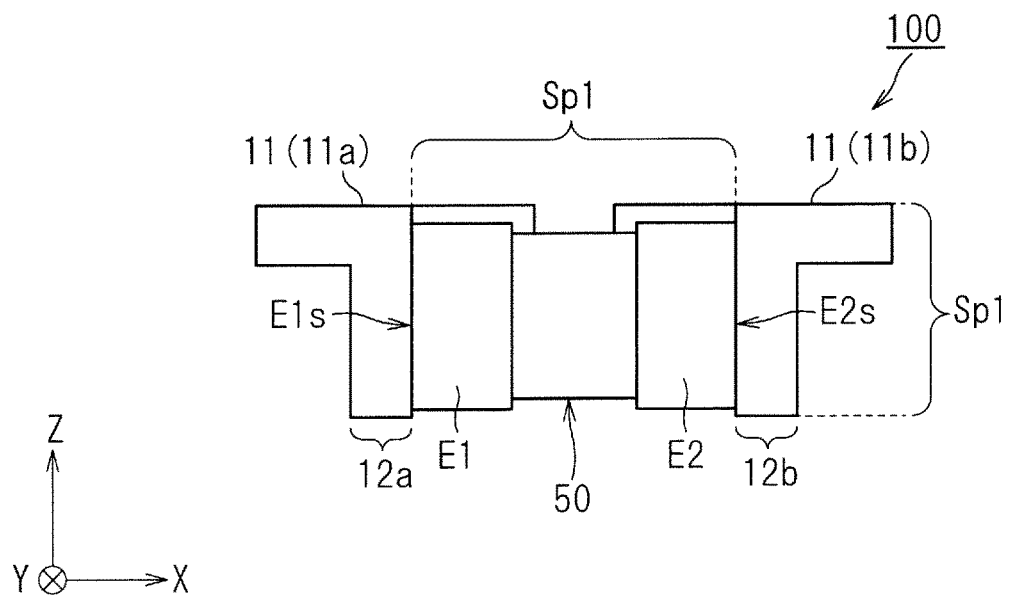

FIGS. 2A and 2B are enlarged views of a periphery of the chip part 50 in FIG. 1. FIG. 2A is a plane view of the periphery of the chip part 50. Moreover, FIG. 2A shows a part of the semiconductor device 100. FIG. 2B is a cross-sectional view of the semiconductor device 100 along line A1-A2 in FIG. 2A.

Referring to FIGS. 2A and 2B, the semiconductor device 100 has a space Sp1. The space Sp1 is a space for containing the chip part 50. The space Sp1 exists across the lead 11a and the lead 11b.

In the following description, a state where the chip part 50 is contained in the space Sp1 is also referred to as a "containing state". In the following description, a state where the chip part 50 is not contained in the space Sp1 is also referred to as a "non-containing state". That is, as the state of the space Sp1, the containing state and the non-containing state exist. FIGS. 2A and 2B show a configuration of the containing state.

The lead 11a has a sinking portion 12a. The lead 11b has a sinking portion 12b. A shape of each of the sinking portion 12a and the sinking portion 12b is, for example, a plate shape. Each of the sinking portion 12a and the sinking portion 12b extends in a vertical direction (Z axis direction). An upper end of the sinking portion 12a is an upper end of the lead 11a. An upper end of the sinking portion 12b is an upper end of the lead 11b.

The sinking portion 12a and the sinking portion 12b are opposed so that the sinking portion 12a and the sinking portion 12b sandwich the space SP1. Moreover, the sinking portion 12a and the sinking portion 12b have elasticity.

The chip part 50 has electrodes E1, E2. The electrode E1 exists in the chip part 50 so that the electrode E1 and the sinking portion 12a are opposed in the containing state. The electrode E2 exists in the chip part 50 so that the electrode E2 and the sinking portion 12b are opposed in the containing state. That is, in one end portion of the chip part 50, the electrode E1 exists. Moreover, in another end portion of the chip part 50, the electrode E2 exists. In the containing state of the present preferred embodiment, the electrode E1 comes into contact with the sinking portion 12a, and the electrode E2 comes into contact with the sinking portion 12b.

Moreover, the sinking portion 12a and the sinking portion 12b are configured so that the sinking portion 12a presses the electrode E1, and the sinking portion 12b presses the electrode E2 in the containing state. For example, an interval between the sinking portion 12a and the sinking portion 12b is set so that the sinking portion 12a presses the electrode E1, and the sinking portion 12b presses the electrode E2 in the containing state. This allows the chip part 50 to be sandwiched and held by the sinking portion 12a and the sinking portion 12b in the containing state.

Moreover, as shown in FIGS. 2A, 2B and 3, the electrode E1 has a plane E1s. The plane E1s is a plane to come into contact with the sinking portion 12a. The electrode E2 has a plane E2s. The plane E2s is a plane to come into contact with the sinking portion 12b.

As shown in FIG. 3, a length L1 of the chip part 50 is a length from the plane E1s to the plane E2s. In the following description, the interval between the sinking portion 12a and the sinking portion 12b is also referred to as an "interval D1". The sinking portion 12a has a plane 12as. The plane 12as is a plane to come into contact with the electrode E1. The sinking portion 12b has a plane 12bs. The plane 12bs is a plane to come into contact with the electrode E2. That is, the interval D1 is an interval between the plane 12as and the plane 12bs in a horizontal direction. When the plurality of intervals between the plane 12as and the interval 12bs in the horizontal direction exist, the interval D1 is the shortest interval among the plurality of intervals.

Moreover, the configuration may be such that the interval D1 in the non-containing state as shown in FIG. 3 is smaller than the length L1 of the chip part 50.

(Conclusion)

As described above, according to the present preferred embodiment, the lead 11*a* and the lead 11*b* are adjacent. The lead 11*a* has the sinking portion 12*a*. The lead 11*b* has the sinking portion 12*b*. The sinking portion 12*a* and the sinking portion 12*b* are opposed so that the sinking portion 12*a* and the sinking portion 12*b* sandwich the space Sp1. The sinking portion 12*a* and the sinking portion 12*b* are configured so that the sinking portion 12*a* presses the electrode E1, and the sinking portion 12*b* presses the electrode E2 in the containing state.

This allows the two electrodes of the chip part to be fixed to the two adjacent leads without using the joining material.

Moreover, according to the present preferred embodiment, the sinking portion 12*a* and the sinking portion 12*b* are configured so that the sinking portion 12*a* presses the electrode E1, and the sinking portion 12*b* presses the electrode E2 in the containing state. The sinking portions 12*a*, 12*b* are contained in the lead frame 10. Thus, the chip part 50 can be held without using the joining material in a state where conductivity of the chip part 50 and the leads 11*a*, 11*b* in the lead frame 10 is secured.

This makes it unnecessary to maintain a high-temperature situation for resin curing, solder melting, or the like. Thus, the semiconductor device can be simplified, and a supply process of the joining material and the like can be eliminated. Accordingly, productivity of the semiconductor device can be enhanced.

Moreover, according to the present preferred embodiment, the configuration may be such that the interval D1 in the non-containing state is smaller than the length L1 of the chip part 50. Thereby, when the chip part 50 is contained in the space Sp1, the interval D1 between the sinking portion 12*a* and the sinking portion 12*b* is extended up to the length L1 of the chip part 50.

Thereby, in the lead 11*a* and the lead 11*b* is generated a restoring force (spring property) for the interval D1 between the sinking portion 12*a* and the sinking portion 12*b* to approach the interval D1 in the non-containing state. Accordingly, the sinking portion 12*a* and the sinking portion 12*b* sandwich the chip part 50. This allows the chip part 50 to be firmly fixed in the space Sp1. That is, the chip part 50 can be stably held.

The configuration of the semiconductor device 100 is not limited to the foregoing configuration. The semiconductor device 100 may include, for example, the plurality of die pads 15, and the plurality of semiconductor chips S1.

<First Modification>

Figure 4A:
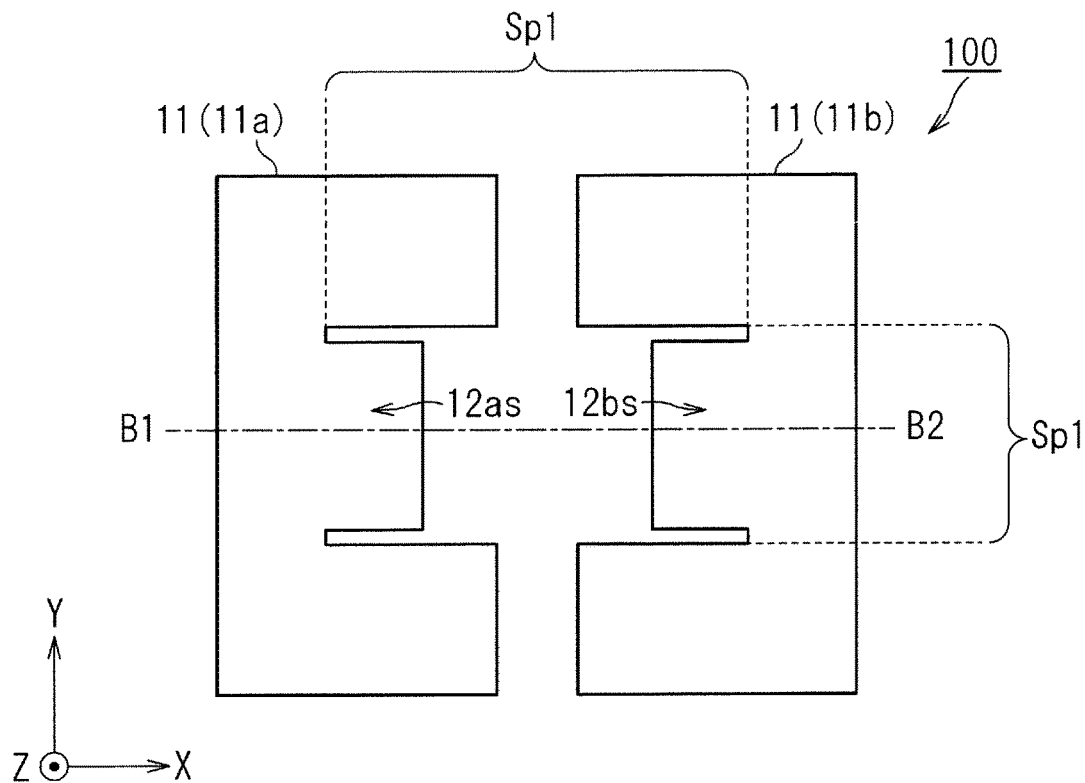
FIGS. 4A and 4B are views for describing a configuration of a first modification.
Figure 4B:
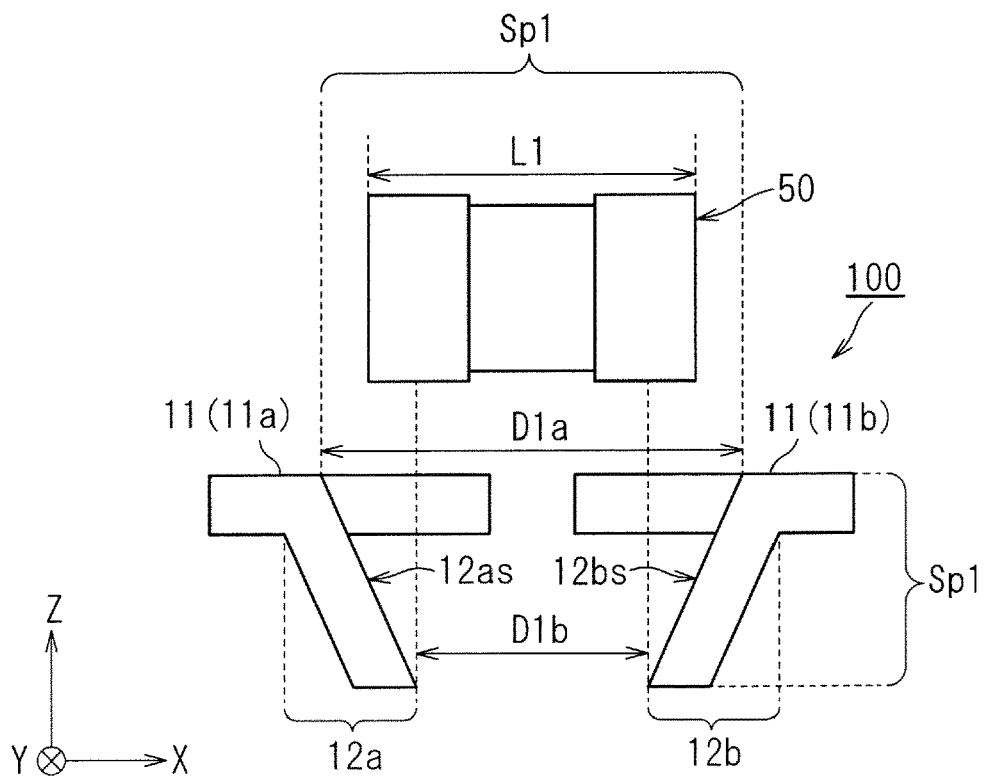

A configuration of the present modification is applied to the configuration of the first preferred embodiment. FIGS. 4A and 4B are views for describing the configuration of a first modification. FIG. 4A is a plane view for describing the configuration of the first modification. FIG. 4B is a cross-sectional view of the semiconductor device 100 along line B1-B2 in FIG. 4A.

In the present modification, each of the sinking portions 12*a*, 12*b* is inclined obliquely. In the following description, an interval between an upper portion of the plane 12*as* and an upper portion of the plane 12*bs* is also referred to as an "interval D1*a*". The interval D1*a* is, for example, an interval between an upper end of the plane 12*as* and an upper end of the plane 12*bs*. In the following description, a lower portion of the plane 12*as* and a lower portion of the plane 12*bs* is also referred to as an "interval D1*b*". The interval D1*b* is, for example, an interval between a lower end of the plane 12*as* and a lower end of the plane 12*bs*.

The interval D1*a* in the non-containing state is larger than the length L1 of the chip part 50. The interval D1*b* in the non-containing state is smaller than the length L1 of the chip part 50. In the present modification, each of the planes 12*as*, 12*bs* functions as a tapered plane.

Figure 5:
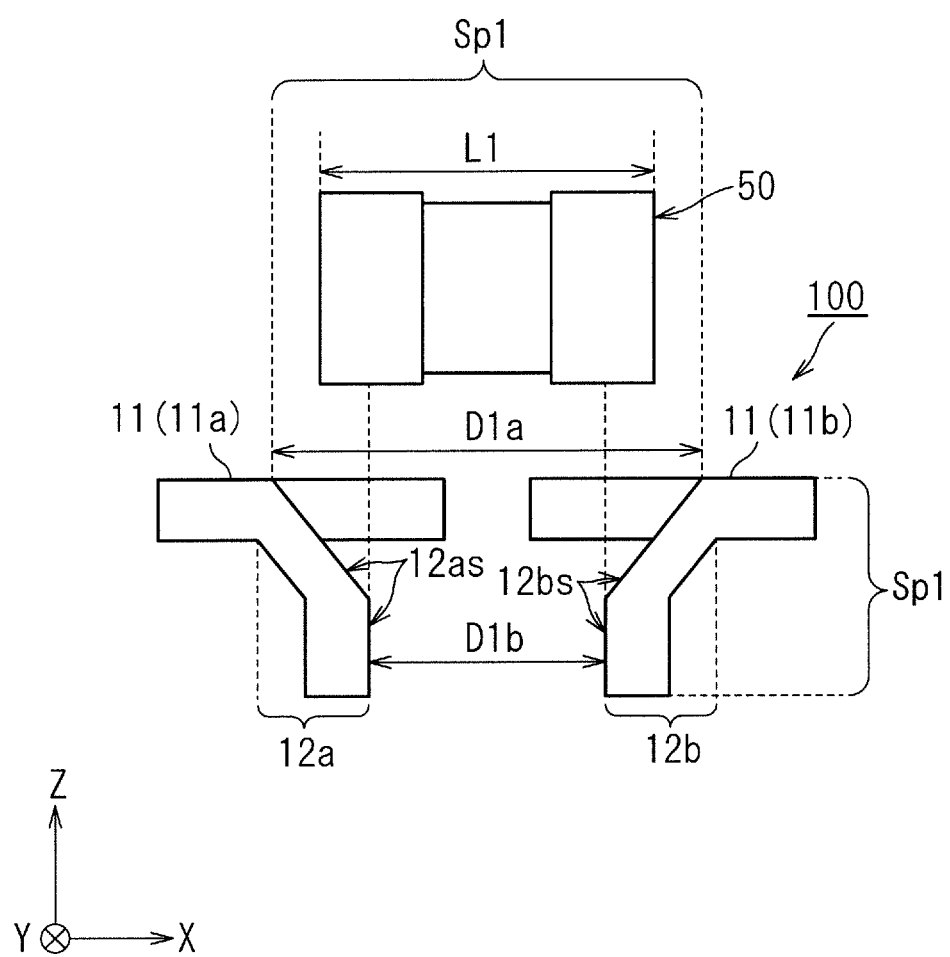
FIG. 5 is a view for describing another configuration of the first modification.

As shown in FIG. 5, each of the sinking portions 12*a*, 12*b* may be bent. That is, each of the planes 12*as*, 12*bs* may be bent. In a configuration in FIG. 5, the interval D1*b* is an interval between the lower portion of the plane 12*as* and the lower portion of the plane 12*bs*.

As described above, according to the present modification, the interval D1*a* in the non-containing state is larger than the length L1 of the chip part 50. The interval D1*b* in the non-containing state is smaller than the length L1 of the chip part 50. Each of the planes 12*as*, 12*bs* functions as a tapered plane.

Thereby, when the chip part 50 is contained in the space Sp1, the interval D1*b* is extended up to the length L1 of the chip part 50 so that the chip part 50 reaches the lower end of each of the planes 12*as*, 12*bs*. Therefore, in the sinking portion 12*a* and the sinking portion 12*b*, and the lead 11*a* and the lead 11*b*, restoring forces are generated.

Accordingly, both sides of the chip part 50 are sandwiched by the sinking portion 12*a* and the sinking portion 12*b*. As a result, the chip part 50 is stably held. The interval D1*a* in the non-containing state is larger than the length L1 of the chip part 50. This allows the chip part 50 to be inserted into the space Sp1 without interfering with upper ends of the leads 11*a*, 11*b* of the lead frame 10. That is, the chip part 50 can be easily inserted into the space Sp1.

From the above, the chip part 50 can be easily inserted into the space Sp1 in a situation where a fixing force of the chip part 50 by the restoring forces (spring property) is maintained, the restoring forces being generated by the extension of the interval between the leads 11*a*, 11*b*.

<Second Modification>

A configuration of the present modification is applied to all or a part of the first preferred embodiment and the first modification. FIG. 6 is a view for describing the configuration of a second modification. FIG. 6 shows, as one example, a state where the configuration of the second modification is applied to the configuration in FIG. 2B in the first preferred embodiment.

In the second modification, a stopper X1*a* is provided in a bottom portion of the sinking portion 12*a*. A stopper X1*b* is provided in a bottom portion of the sinking portion 12*b*. Each of the stoppers X1*a*, X1*b* supports a lower portion of the chip part 50 in the containing state. In the containing state, the stopper X1*a* supports the electrode E1 of the chip part 50. In the containing state, the stopper X1*b* supports the electrode E2 of the chip part 50.

As described above, according to the present modification, each of the stoppers X1*a*, X1*b* supports the lower portion of the chip part 50 in the containing state. Thus, when the chip part 50 is inserted into the space Sp1, the chip part 50 can be disposed at a predetermined position in the space Sp1. That is, when the chip part 50 is inserted into the space Sp1, the positioning of the chip part 50 in the vertical direction can be performed. Therefore, the chip part 50 can be stably inserted into the space Sp1. Moreover, the chip part 50 can be prevented from dropping below the space Sp1.

<Third Modification>

Figure 7A:
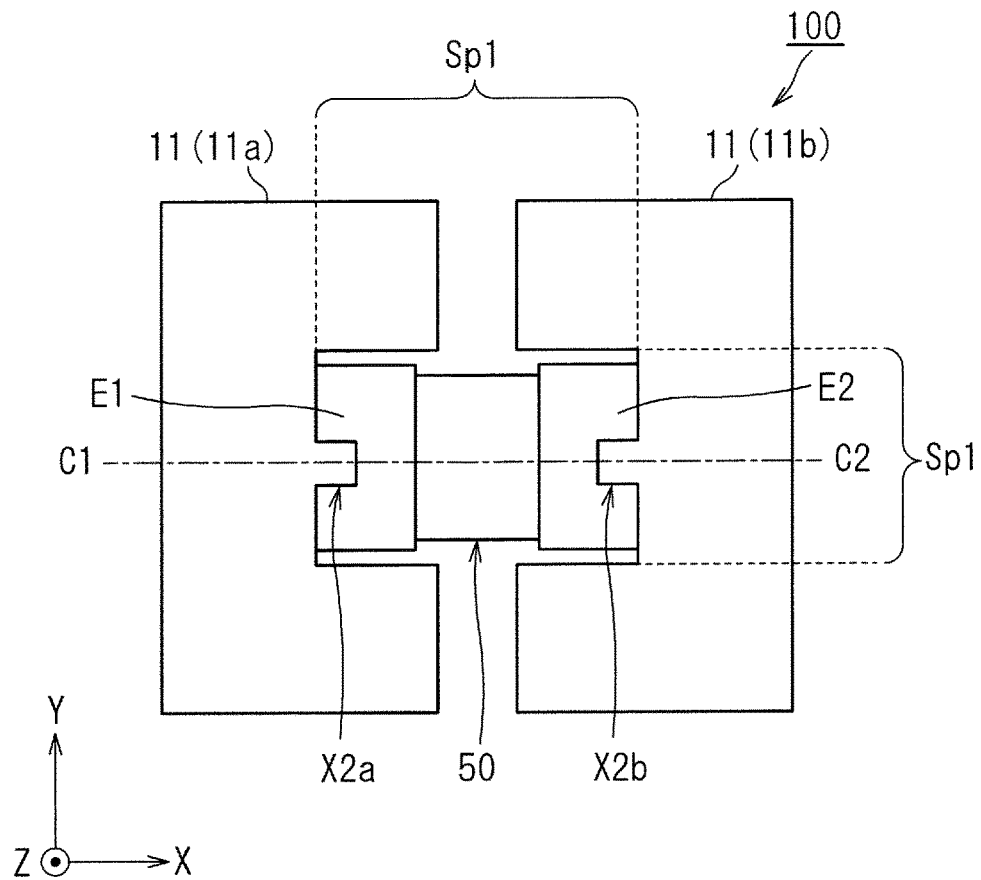
FIGS. 7A and 7B are views for describing a configuration of a third modification.
Figure 7B:
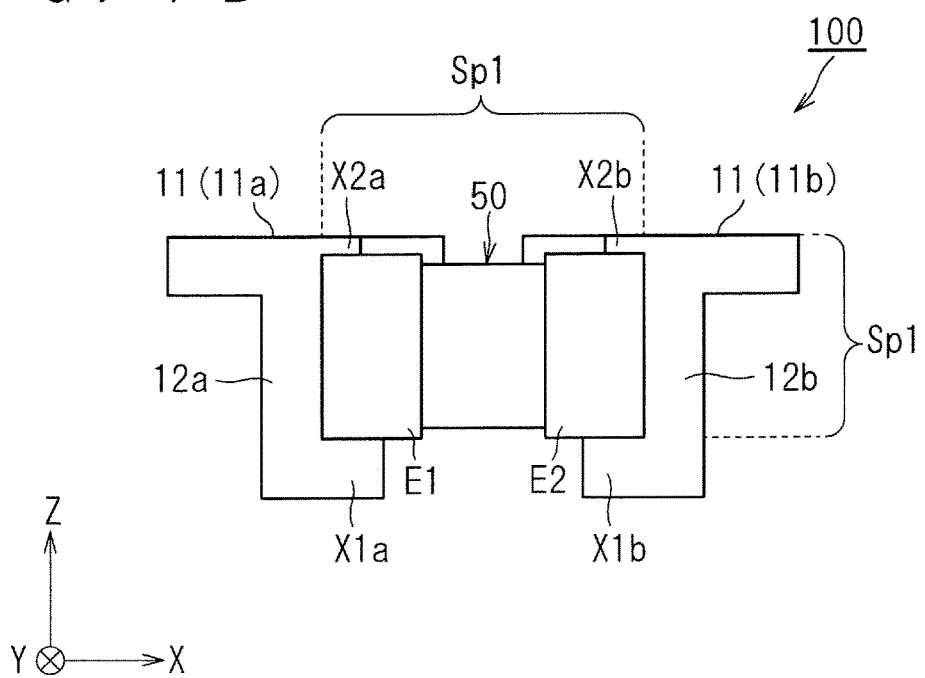

A configuration of the present modification is applied to all or a part of the first preferred embodiment and the first and second modifications. FIGS. 7A and 7B are views for describing the configuration of a third modification. FIG. 7A is a plane view for describing the configuration of the third modification. FIG. 7B is a cross-sectional view of the semiconductor device 100 along line C1-C2 in FIG. 7A. FIG. 7B shows, as one example, a state where the configuration of the present modification is applied to the configuration in FIG. 6 in the second modification.

In the third modification, the lead frame 10 has stoppers X2a, X2b. Specifically, the stopper X2a is provided in an upper portion of the sinking portion 12a. Moreover, the stopper X2b is provided in an upper portion of the sinking portion 12b.

Each of the stoppers X2a, X2b covers an upper portion of the chip part 50 in the containing state. For example, the stoppers X2a, X2b are provided so that the stoppers X2a, X2b come into contact with the upper portion of the chip part 50. Specifically, the stoppers X2a, X2b are provided so that the stopper X2a comes into contact with an upper portion of the electrode E1 of the chip part 50, and the stopper X2b comes into contact with an upper portion of the electrode E2 of the chip part 50.

For example, the stoppers X2a, X2b may be provided so that the stoppers X2a, X2b do not come into contact with the upper portion of the chip part 50.

Next, one example of a creation process of the stoppers X2a, X2b will be described. First, as shown in FIG. 6, the chip part 50 is disposed in the space Sp1 sandwiched by the sinking portion 12a and the sinking portion 12b.

In the following description, a member for creating the stopper X2a is also referred to as a "member A". The member A is a member that makes into the stopper X2a by crushing the relevant member A by a press process described later. Moreover, in the following description, a member for creating the stopper X2b is also referred to as a "member B". The member B is a member that makes into the stopper X2b by crushing the relevant member B by the press process described later.

The member A (not shown) exists at a predetermined position in the upper portion of the sinking portion 12a in FIG. 6. The predetermined position in the upper portion of the sinking portion 12a in FIG. 6, is, for example, a vicinity of the upper portion of the sinking portion 12a where the stopper X2a exists in FIGS. 7A and 7B.

The member B (not shown) exists at a predetermined position in the upper portion of the sinking portion 12b in FIG. 6. The predetermined position in the upper portion of the sinking portion 12b in FIG. 6, is, for example, a vicinity of the upper portion of the sinking portion 12b where the stopper X2b exists in FIGS. 7A and 7B.

Next, the press process is performed. Before the press process is performed, the bottom portion of the sinking portion 12a where the member A not shown exists, the stopper X1a, the bottom portion of the sinking portion 12b where the member B not shown exists, and the stopper X1b are placed on a plate 22 in FIG. 8.

Figure 8:
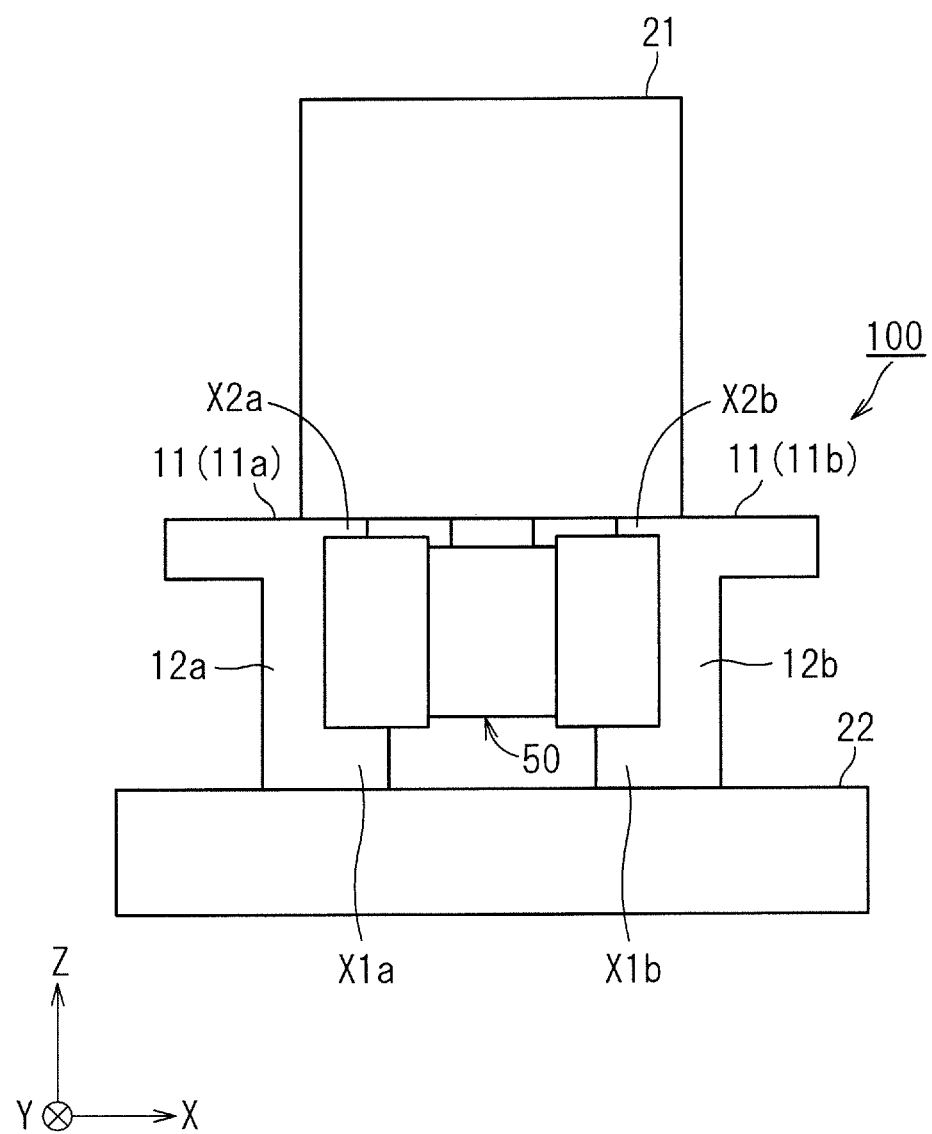
FIG. 8 is a view for describing a creation process of stoppers in the third modification.

In the press process, as shown in FIG. 8, the upper ends of the sinking portion 12a and the sinking portion 12b are crushed by a press 21 to thereby create the stoppers X2a, X2b. Specifically, in the press process, the member A of the sinking portion 12a and the member B of the sinking portion 12b are crushed by the press 21 to thereby create the stoppers X2a, X2b.

As described above, according to the present modification, each of the stoppers X2a, X2b covers the upper portion of the chip part 50 in the containing state. This can prevent the chip part 50 in the containing state from sticking out above the space Sp1.

<Fourth Modification>

A configuration of the present modification is applied to all or a part of the first preferred embodiment, and the first, second, and third modifications. In the present modification, materials making the lead frame 10, the leads 11a, 11b, and the sinking portions 12a, 12b in the first preferred embodiment, and the first, second, and third modifications will be described.

The lead frame 10 is made of any of aluminum (Al) and copper (Cu). Therefore, each of the components included in the lead frame 10 (leads 11a, 11b, sinking portions 12a, 12b, stoppers X1a, X1b, X2a, X2b) is also made of any of aluminum and copper.

The lead frame 10 may be made of a chemical compound. For example, the lead frame 10 may be made of a chemical compound containing aluminum and copper. That is, each of the components included in the lead frame 10 (leads 11a, 11b, sinking portions 12a, 12b, stoppers X1a, X1b, X2a, X2b) may also be made of the chemical compound containing aluminum and copper.

As described above, according to the present modification, the lead frame 10 is made of the above-described material. Therefore, the spring property for holding the chip part 50 can be secured while securing an electrical conductivity required of the semiconductor device 100 as a module.

<Fifth Modification>

A configuration of the present modification is applied to all or a part of the first preferred embodiment and the first, second, third, and fourth modifications. In the following description, a material making the lead frame 10 is also referred to as a "material m1".

FIG. 9 is a view for describing the configuration of a fifth modification. FIG. 9 shows a peripheral configuration of the leads 11a, 11b in the non-containing state. In FIG. 9, as one example, the leads 11a, 11b having the configuration of the second modification are shown.

In the present modification, as shown in FIG. 9, a metal film M1 is provided in the plane 12as of the sinking portion 12a. A metal film M2 is provided in the plane 12bs of the sinking portion 12b. In the following description, a material making each of the metal film M1 and the metal film M2 is also referred to as a "material m2". The material m2 is a material different from the material m1 making the lead frame 10. Each of the metal film M1 and the metal film M2 is made of the material m2.

Moreover, the metal film M1 has a plane M1s as a surface. The metal film M2 has a plane M2s as a surface. In the following description, a material provided in each of the planes M1s, M2s is also referred to as a "material m3". The material m3 is provided in each of the planes M1s, M2s as a surface. The material m3 is, for example, any one material of tin (Sn), silver (Ag), and gold (Au). Moreover, the material m3 may be made of a chemical compound. For example, the material m3 provided in each of the planes M1s, M2s may be a chemical compound containing at least one material of tin, silver, and gold as materials. Moreover, the material m3 may be a chemical compound containing at least two materials of tin, silver, and gold as materials.

In the configuration of the present modification, a surface of the material m3 provided in the plane M1s comes into contact with the electrode E1 in the containing state. Moreover, a surface of the material m3 provided in the plane M2s comes into contact with the electrode E2 in the containing state. Moreover, a space sandwiched by the material m3 provided in the plane M1s, and the material m3 provided in the plane M2s is the space Sp1.

As described above, according to the present modification, the metal film M1 is provided in the plane 12as of the sinking portion 12a. The metal film M2 is provided in the plane 12bs of the sinking portion 12b. The foregoing material m3 is provided in each of the plane M1s of the metal film M1, and the plane M2s of the metal film M2. This can prevent oxidation of the sinking portions 12a, 12b of the lead frame 10. Therefore, electrical contact between the sinking portions 12a, 12b, and the chip part 50 can be stabilized.

<Sixth Modification>

A configuration of the present modification is applied to all or a part of the first preferred embodiment and the first, second, third, fourth, and fifth modifications.

FIG. 10 is a view showing a configuration of the chip part 50 according to a sixth modification. In the present modification, as shown in FIG. 10, a metal film M1e is provided in a plane E1s of the electrode E1. A metal film M2e is provided in a plane E2s of the electrode E2. Each of the metal film M1e and the metal film M2e is made of the foregoing material m2.

Moreover, the metal film M1e has a plane M1es. In the present modification, the plane M1es is a plane to come into contact with the sinking portion 12a. Moreover, the metal film M2e has a plane M2es. In the present modification, the plane M2es is a plane to come into contact with the sinking portion 12b. The foregoing material m3 is provided in each of the planes M1es, M2es.

In the configuration of the present modification, a surface of the material m3 provided in the plane M1es is one side surface of the chip part 50. Moreover, a surface of the material m3 provided in the plane M2es is another side surface of the chip part 50.

As described above, according to the present modification, the metal film M1e is provided in the plane E1s of the electrode E1. The metal film M2e is provided in the plane E2s of the electrode E2. The foregoing material m3 is provided in each of the plane M1es of the metal film M1e, and the plane M2es of the metal film M2e. This can prevent oxidation of each of the electrodes E1, E2. Thus, electrical contact between the electrodes E1, E2 of the chip part 50, and the sinking portions 12a, 12b can be stabilized.

Note that, within the scope of the invention, the present invention can freely combine the preferred embodiment and the modifications, and can appropriately modify and omit the preferred embodiment and the modifications.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device having a space for containing a chip part, the semiconductor device comprising:
    the chip part having a first electrode and a second electrode; and
    a lead frame having a first lead and a second lead as terminals, wherein
    the first lead and the second lead are adjacent,
    the space exists across the first lead and the second lead,
    the first lead has a first sinking portion,
    the second lead has a second sinking portion,
    the first sinking portion and the second sinking portion are opposed so that the first sinking portion and the second sinking portion sandwich the space,
    as a state of the space, there is a containing state where the chip part is contained in the space,
    the first electrode exists in the chip part so that the first electrode and the first sinking portion are opposed in the containing state,
    the second electrode exists in the chip part so that the second electrode and the second sinking portion are opposed in the containing state,
    the first sinking portion and the second sinking portion are configured so that in the containing state, the first sinking portion presses the first electrode, and the second sinking portion presses the second electrode,
    a first recess exists on an upper surface of the first lead in a plan view,
    a second recess opposing the first recess exists on an upper surface of the second lead in a plan view,
    the first recess of the first lead is a part of the space for containing the chip part, and
    the second recess of the second lead is another part of the space for containing the chip part.

2. The semiconductor device according to claim 1, wherein
    a shape of each of the first sinking portion and the second sinking portion is a plate shape, and
    each of the first sinking portion and the second sinking portion has an elasticity.

3. The semiconductor device according to claim 1, wherein
    as the state of the space, there is further a non-containing state where the chip part is not contained in the space,
    the first electrode has a first plane to come into contact with the first sinking portion,
    the second electrode has a second plane to come into contact with the second sinking portion,
    a length of the chip part is a length from the first plane to the second plane, and
    an interval between the first sinking portion and the second sinking portion in the non-containing state is smaller than the length of the chip part.

4. The semiconductor device according to claim 1, wherein
    the first electrode has a first plane to come into contact with the first sinking portion,
    the second electrode has a second plane to come into contact with the second sinking portion,
    a length of the chip part is a length from the first plane to the second plane,
    as the state of the space, there is further a non-containing state where the chip part is not contained in the space,
    the first sinking portion has a third plane to come into contact with the first electrode,
    the second sinking portion has a fourth plane to come into contact with the second electrode,
    an interval between an upper portion of the third plane and an upper portion of the fourth plane in the non-containing state is larger than the length of the chip part, and
    an interval between a lower portion of the third plane and a lower portion of the fourth plane in the non-containing state is smaller than the length of the chip part.

5. The semiconductor device according to claim 1, wherein
    in a bottom portion of each of the first sinking portion and the second sinking portion, a first stopper that supports a lower portion of the chip part in the containing state is provided.

6. The semiconductor device according to claim 5, wherein the lead frame has a second stopper that covers an upper portion of the chip part in the containing state.

7. The semiconductor device according to claim 1, wherein
the lead frame is made of any of aluminum and copper.

8. The semiconductor device according to claim 1, wherein
the lead frame is made of a chemical compound containing aluminum and copper.

9. The semiconductor device according to claim 1, wherein
the first sinking portion has the third plane to come into contact with the first electrode,
the second sinking portion has the fourth plane to come into contact with the second electrode,
in the third plane, a first metal film is provided,
in the fourth plane, a second metal film is provided, and
each of the first metal film and the second metal film is made of a second material different from a first material making the lead frame.

10. The semiconductor device according to claim 9, wherein
in a surface of each of the first metal film and the second metal film, a third material of any one of tin, silver and gold as the third materials is provided.

11. The semiconductor device according to claim 9, wherein
in a surface of each of the first metal film and the second metal film, a chemical compound is provided, the chemical compound containing at least two third materials of tin, silver, and gold as the third materials.

12. The semiconductor device according to claim 1, wherein
the first electrode has a first plane to come into contact with the first sinking portion,
the second electrode has a second plane to come into contact with the second sinking portion, and
in each of the first plane and the second plane, the third material of any one of tin, silver, and gold as the third materials is provided.

13. The semiconductor device according to claim 1, wherein
the first electrode has the first plane to come into contact with the first sinking portion,
the second electrode has the second plane to come into contact with the second sinking portion, and
in each of the first plane and the second plane, a chemical compound is provided, the chemical compound containing at least two third materials of tin, silver, and gold as the third materials.

* * * * *